(12) United States Patent
Nishikawa et al.

(10) Patent No.: US 11,158,514 B2
(45) Date of Patent: Oct. 26, 2021

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Toshiyuki Nishikawa, Nonoichi Ishikawa (JP); Kazuhiko Komatsu, Oita Oita (JP); Shinji Nunotani, Kanazawa Ishikawa (JP); Yoshiyuki Harada, Nonoichi Ishikawa (JP); Hideto Sugawara, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 147 days.

(21) Appl. No.: 16/562,555

(22) Filed: Sep. 6, 2019

(65) Prior Publication Data
US 2020/0303197 A1    Sep. 24, 2020

(30) Foreign Application Priority Data

Mar. 18, 2019    (JP) .............................. JP2019-050073

(51) Int. Cl.
*H01L 21/285*    (2006.01)
*H01L 33/40*    (2010.01)
*H01L 29/47*    (2006.01)

(52) U.S. Cl.
CPC ...... *H01L 21/28581* (2013.01); *H01L 29/475* (2013.01); *H01L 33/40* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 5,422,307 A * | 6/1995 | Ishii ................. | H01L 23/53242 257/E23.162 |
| 6,555,457 B1 * | 4/2003 | Derkits, Jr. .......... | H01L 29/452 257/E29.144 |
| 6,987,287 B2 | 1/2006 | Liu et al. | |
| 9,293,598 B2 | 3/2016 | Yamazaki et al. | |
| 2005/0194587 A1 | 9/2005 | Hsieh et al. | |

FOREIGN PATENT DOCUMENTS

| | | |
|---|---|---|
| JP | H03-184377 A | 8/1991 |
| JP | 4648031 B2 | 3/2011 |
| JP | 2014-143410 A | 8/2014 |

* cited by examiner

*Primary Examiner* — Evren Seven

(57) ABSTRACT

A semiconductor device includes an n-type semiconductor layer; a first metal layer provided on the n-type semiconductor layer, the first metal layer including first atoms capable of being n-type impurities in the n-type semiconductor layer; a second metal layer provided on the first metal layer, the second metal layer including titanium atoms; a third metal layer provided on the second metal layer; and a second atom capable of being a p-type impurity in the n-type semiconductor layer. The second atom and a part of the titanium atoms are included in a vicinity of an interface between the first metal layer and the second metal layer.

9 Claims, 5 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2019-050073, filed on Mar. 18, 2019; the entire contents of which are incorporated herein by reference.

FIELD

Embodiments relate to a semiconductor device and a method of manufacturing the same.

BACKGROUND

A semiconductor device is required to have a contact resistance reduced between a semiconductor and an electrode. For example, there is an electrode in which a metal including n-type impurities contacts the n-type semiconductor, and the contact resistance thereof is reduced by a heat treatment.

DETAILED DESCRIPTION

Figure 1:
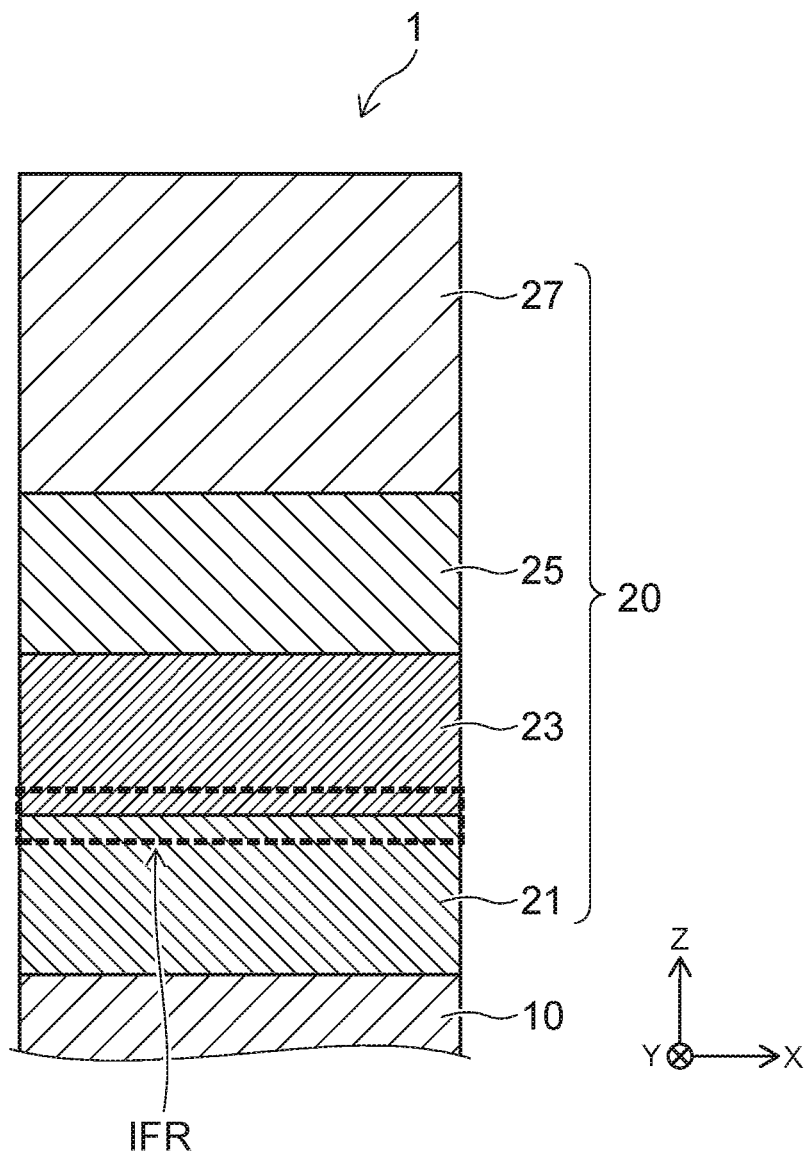
FIG. 1 is a schematic cross sectional view showing an electrode structure of a semiconductor device according to an embodiment.

According to one embodiment, a semiconductor device includes an n-type semiconductor layer; a first metal layer provided on the n-type semiconductor layer, the first metal layer including first atoms capable of being n-type impurities in the n-type semiconductor layer; a second metal layer provided on the first metal layer, the second metal layer including titanium atoms; a third metal layer provided on the second metal layer; and a second atom capable of being a p-type impurity in the n-type semiconductor layer. The second atom and a part of the titanium atoms are included in a vicinity of an interface between the first metal layer and the second metal layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross sectional view showing an electrode structure of a semiconductor device 1 according to an embodiment. The semiconductor device 1 includes an n-type semiconductor layer 10 and an electrode 20.

The n-type semiconductor layer 10 is, for example, an n-type semiconductor substrate, an n-type semiconductor layer on a semiconductor substrate, or an n-type semiconductor region in the semiconductor substrate. The n-type semiconductor layer 10 is made of the compound semiconductor such as gallium arsenide, indium phosphorous or gallium antimony.

As shown in FIG. 1, the electrode 20 has a stacked structure including a metal layer 21, a metal layer 23, a metal layer 25, and a metal layer 27.

The metal layer 21 is provided on the n-type semiconductor layer 10. The metal layer 21 contacts, for example, the n-type semiconductor layer 10, and is electrically connected thereto. The metal layer 21 includes, for example, a first element which is possible to be an n-type impurity of the n-type semiconductor layer 10. Furthermore, the metal layer 21 includes a second element which is possible to be a p-type impurity of the n-type semiconductor layer 10. The metal layer 21 serves as a contact layer to the n-type semiconductor layer 10.

The metal layer 21 includes, for example, gold (Au) as a major constituent. The metal layer 21 includes, for example, germanium (Ge) as the first element. The metal layer 21 includes, for example, at least one of zinc (Zn), magnesium (Mg) or beryllium (Be) as the second element.

The metal layer 23 is provided on the metal layer 21. The metal layer 23 includes, for example, titanium (Ti). The metal layer 23 includes the titanium, for example, as a major constituent.

The metal layer 25 is provided on the metal layer 23. The metal layer 25 includes, for example, platinum (Pt). The metal layer 25 includes the platinum, for example, as a major constituent.

The metal layer 27 is provided on the metal layer 25. The metal layer 27 includes, for example, gold (Au). The metal layer 27 includes the gold, for example, as a major constituent. The metal layer 27 serves, for example, as a bonding layer to which metal wires and like (not shown) are connected.

In the electrode 20, the metal layer 23 and the metal layer 25 serve as barrier layers. That is, the metal layer 23 and the metal layer 25 prevent, for example, the metal layer 27 and the metal wires (not shown) from the connection strength therebetween decreased by the diffusion of metal elements from the metal layer 21 into the metal layer 27.

The electrode 20 includes a region in a vicinity of the boundary (or interface) between the metal layer 21 and the metal layer 23 (hereinafter, referred to as a boundary region IFR). For example, the first element, the second element and the titanium element are mixed in the boundary region IFR. It may be possible to refer to the region in the vicinity of the boundary as a region including the boundary or a region including the interface.

Figure 2:
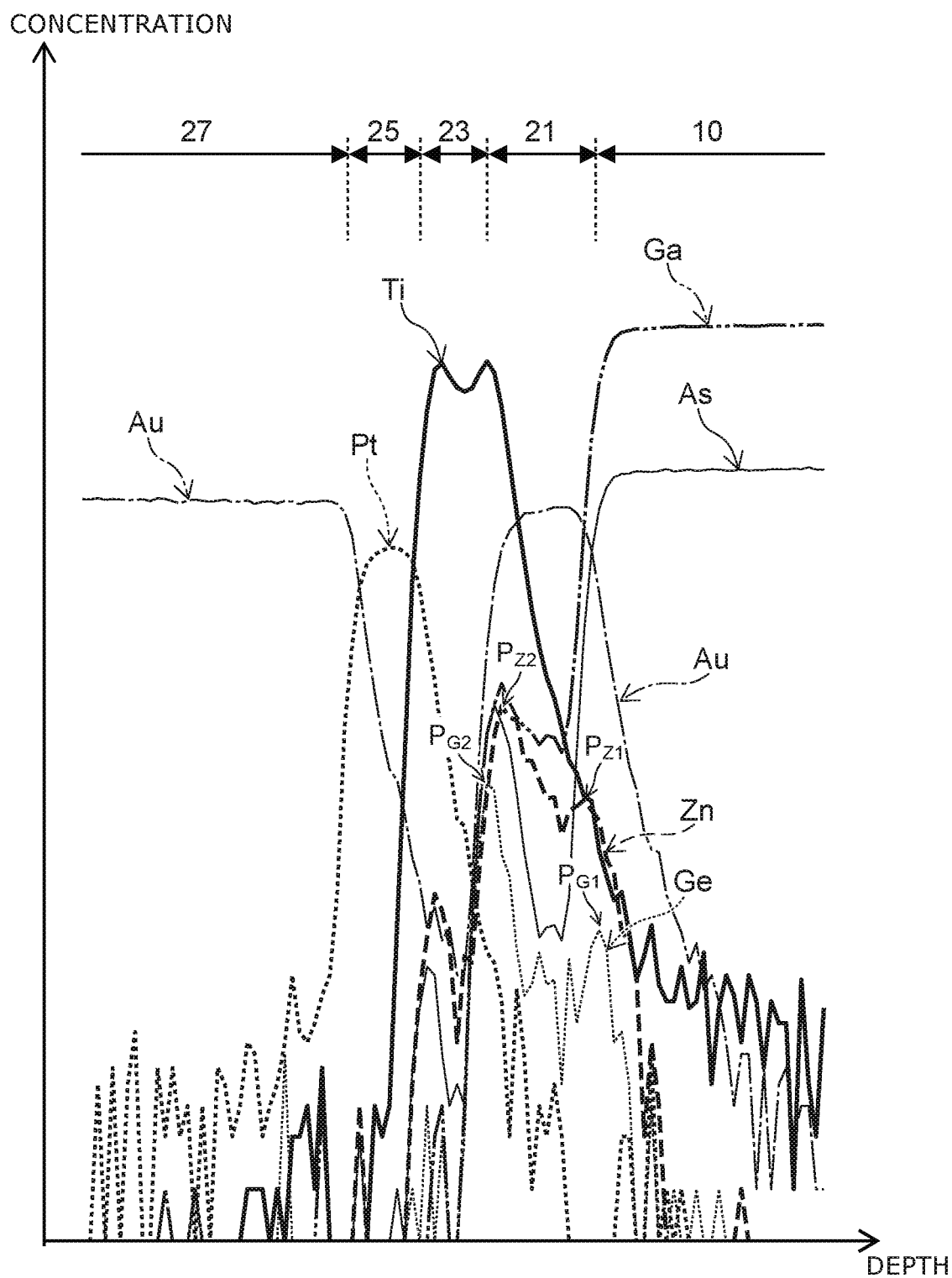
FIG. 2 is an atomic concentration profile showing the electrode structure of the semiconductor device according to the embodiment.

FIG. 2 is an atomic concentration profile showing an electrode structure of the semiconductor device 1 according to the embodiment. FIG. 2 is a SIMS (Secondary Ion Mass Spectroscopy) profile showing a distribution of metal elements in the electrode 20. The horizontal axis represents a depth from a surface of the electrode 20, and the vertical axis represents a concentration of the metal elements. In the profile in FIG. 2, the atomic concentrations of the respective elements are not absolutely calibrated from each other, and each profile shows the relative change of the atomic concentration in the depth direction. The metal elements may have actually the high-low relationship different from the concentrations in FIG. 2.

As shown in FIG. 2, the n-type semiconductor layer 10 includes gallium (Ga) and arsenic (As). The metal layer 21 includes gold (Au), zinc (Zn), and germanium (Ge). The metal layer 23 includes titanium (Ti). The metal layer 25 includes platinum (Pt). The metal layer 27 includes gold (Au).

In the metal layer 21, the distribution of zinc (Zn) has a first peak $P_{Z1}$ and a second peak $P_{Z2}$. The first peak $P_{Z1}$ is positioned between the n-type semiconductor layer 10 and the second peak $P_{Z2}$. The second peak $P_{Z2}$ is positioned between the first peak $P_{Z1}$ and the metal layer 23. The zinc concentration at the first peak $P_{Z1}$ is lower than the zinc concentration at the second peak $P_{Z2}$.

In the metal layer 21, the distribution of germanium (Ge) has a first peak $P_{G1}$ and a second peak $P_{G2}$. The first peak $P_{G1}$ is positioned between the n-type semiconductor layer 10 and the second peak $P_{G2}$. The second peak $P_{G2}$ is positioned between the first peak $P_{G1}$ and the metal layer 23. The germanium concentration at the first peak $P_{G1}$ is lower than the germanium concentration at the second peak $P_{G2}$.

As shown in FIG. 2, the electrode 20 has the boundary between the metal layer 21 and the metal layer 23, and the region in the vicinity of the boundary (boundary region IFR) in which germanium, zinc and titanium are mixed. The second peak $P_{G2}$ of germanium and the second peak $P_{Z2}$ of zinc are positioned, for example, in the boundary region IFR.

A method for manufacturing the semiconductor device 1 according to the embodiment will be described herein with reference to FIGS. 3A to 3D. FIGS. 3A to 3D are schematic views showing the manufacturing process of the semiconductor device 1 in order.

Figure 3A:
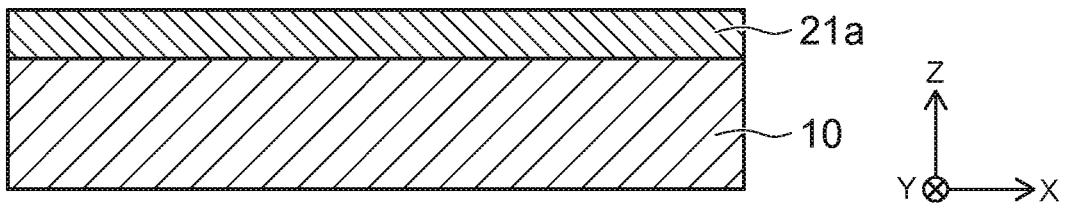
FIGS. 3A to 3D are schematic cross sectional views showing a manufacturing process of the semiconductor device according to the embodiment.

As shown in FIG. 3A, a first layer 21a is formed on the n-type semiconductor layer 10. The first layer 21a is, for example, formed on the n-type semiconductor layer 10 using a vacuum evaporation method. The first layer 21a is formed, for example, by evaporating a gold germanium alloy under a reduced pressure of $4 \times 10^{-4}$ Pascal (Pa) using resistance heating so as to be deposited on the n-type semiconductor layer 10. The first layer 21a has, for example, a thickness of 100 nanometers (nm) in a direction orthogonal to the surface of the n-type semiconductor layer 10 (Z-direction). The first layer 21a has, for example, a thickness in the Z-direction in a range of 80 nm to 500 nm. The first layer 21a includes, for example, gold (Au) as a major constituent, and also includes germanium (Ge).

Figure 3B:
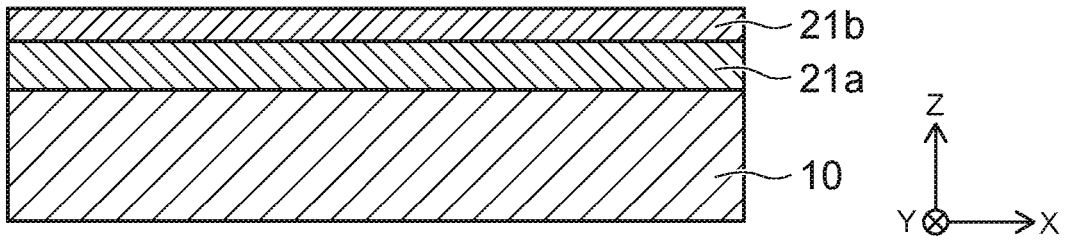

As shown in FIG. 3B, a second layer 21b is formed on the first layer 21a. The second layer 21b is formed, for example, on the first layer 21a by using the vacuum evaporation method. The second layer 21b is formed, for example, by evaporating a gold zinc alloy under a reduced pressure of $4 \times 10^{-4}$ Pascal (Pa) using resistance heating so as to be deposited on the first layer 21a. The second layer 21b has, for example, a thickness of 20 nm in the Z-direction. The second layer 21b has, for example, a thickness in the Z-direction in a range of 4 nm to 200 nm. The second layer 21b includes gold (Au), for example, as a main constituent, and also includes zinc (Zn). The atomic concentration of zinc is, for example, a few atomic percent.

Figure 3C:
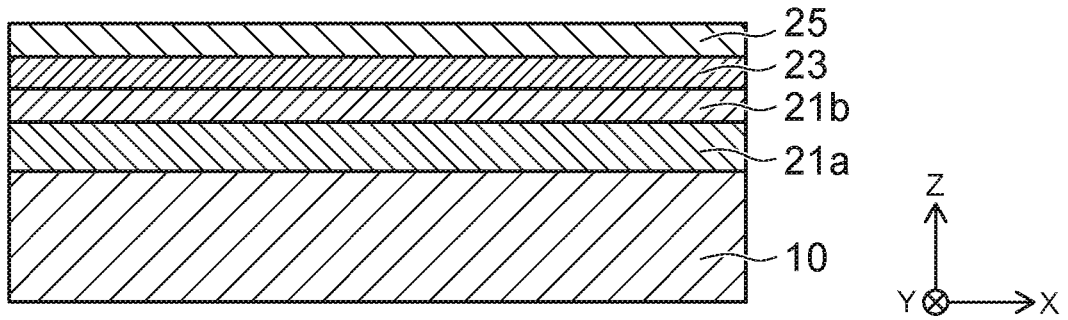

As shown in FIG. 3C, the metal layer 23 is formed on the second layer 21b. The metal layer 23 is formed on the second layer 21b by using, for example, an electron beam evaporation method. The metal layer 23 is formed, for example, by depositing titanium on the second layer 21b that is heated and evaporated by the electron beam irradiation. The second layer 21b has, for example, a thickness of 70 nm in the Z-direction. The metal layer 23 includes the titanium, for example, as a major constituent.

Furthermore, the metal layer 25 is formed on the metal layer 23. The metal layer 25 is formed, for example, on the metal layer 23 by using the electron beam evaporation method. The metal layer 25 is formed by depositing platinum on the metal layer 23 that is heated and evaporated by the electron beam irradiation. The metal layer 25 has, for example, a thickness of 70 nm in the Z-direction. The metal layer 25 includes platinum, for example, as a major constituent.

Figure 3D:
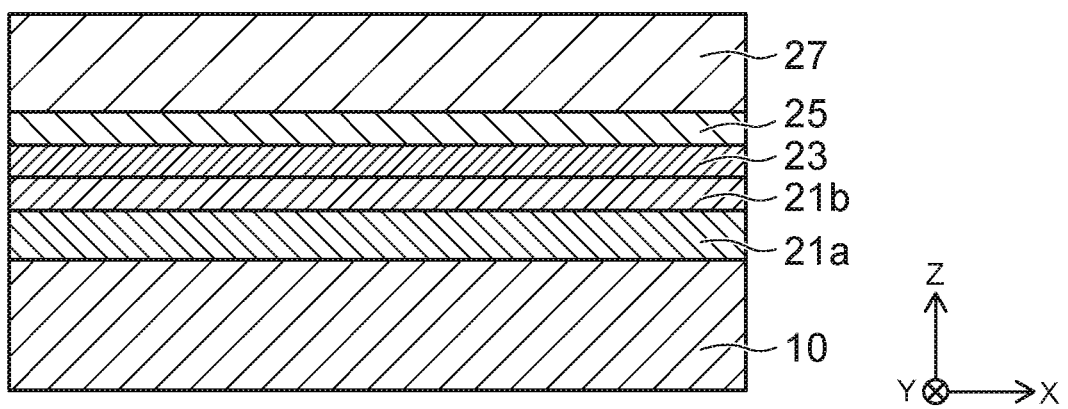

As shown in FIG. 3d, the metal layer 27 is formed on the metal layer 25. The metal layer 27 is formed, for example, on the metal layer 25 by using the electron beam evaporation method. The metal layer 27 is formed, for example, by depositing gold on the metal layer 25 that is heated and evaporated by the electron beam irradiation. The metal layer 27 has, for example, a thickness of 600 nm in the Z-direction.

The metal layer 27 includes gold, for example, as a major constituent.

Subsequently, the first layer 21a, the second layer 21b, the metal layer 23, the metal layer 25 and the metal layer 27, which are stacked on the n-type semiconductor layer 10, are heated (for example, using sintering) to form the electrical connection (for example, Ohmic contact) between the n-type semiconductor layer 10 and the electrode 20. The sintering is performed, for example, under a condition of a sintering temperature of 370° C. for 3 minutes in an argon atmosphere. The sintering temperature is set, for example, to be in a temperature range of 270 to 400° C., preferably a temperature range of 300 to 370° C.

The SIMS profiles shown in FIG. 2 exhibit the distributions of metal elements in the electrode 20 after the sintering. In FIG. 2, the metal layer 21 is shown into which the first layer 21a and the second layer 21b are integrated.

As shown in FIG. 2, gold (Au) distributes on both sides of the metal layers 23 and 25 that serve as the barrier layer. In contrast, whereas the first layer 21a and the second layer 21b are deposited such that germanium (Ge) and zinc (Zn) are distributed separately, germanium (Ge) and zinc (Zn) are re-distributed by the sintering. The germanium (Ge) and zinc (Zn) have the distributions changed so as to have the first peaks $P_{G1}$, $P_{Z1}$ on the n-type semiconductor layer side, respectively, and have the second peaks $P_{G2}$ and $P_{Z2}$ on the metal layer 23 side, respectively.

For example, in the electrode structure without the second layer 21b, germanium in the first layer 21a may diffuse through the metal layer 23 and the metal layer 25 into the metal layer 27 by the sintering. Thereby, for example, an adverse effect may be occurs such that the connection strength is degraded between the metal layer 27 and the metal wire. Moreover, the germanium concentration in the metal layer 21 may decrease, increasing the contact resistance between the n-type semiconductor 10 and the electrode 20.

In contrast, it is found in the SIMS profiles in FIG. 2 that the diffusion of germanium (Ge) is blocked in the vicinity of the boundary between the metal layer 21 and the metal layer 23. That is, it is found that the diffusion of germanium through the metal layer 23 and the metal layer 25 is stopped by adding the second layer 21b. For example, it is considered that, through the process of sintering, titanium in the metal layer 23 and zinc in the second layer 21b are bounded or formed to be alloy, serving as the barrier layer that blocks the germanium diffusion.

As described above, in the electrode 20 according to the embodiment, the first element capable of being the n-type impurity in the first layer 21a may be prevented from diffusing into the metal layers 23, 25 and 27 by providing the second layer 21b that includes the second element capable of being the p-type impurity in the n-type semiconductor layer 10. Thus, it is possible to reduce the contact resistance between the n-type semiconductor layer 10 and the electrode 20.

Figure 4:
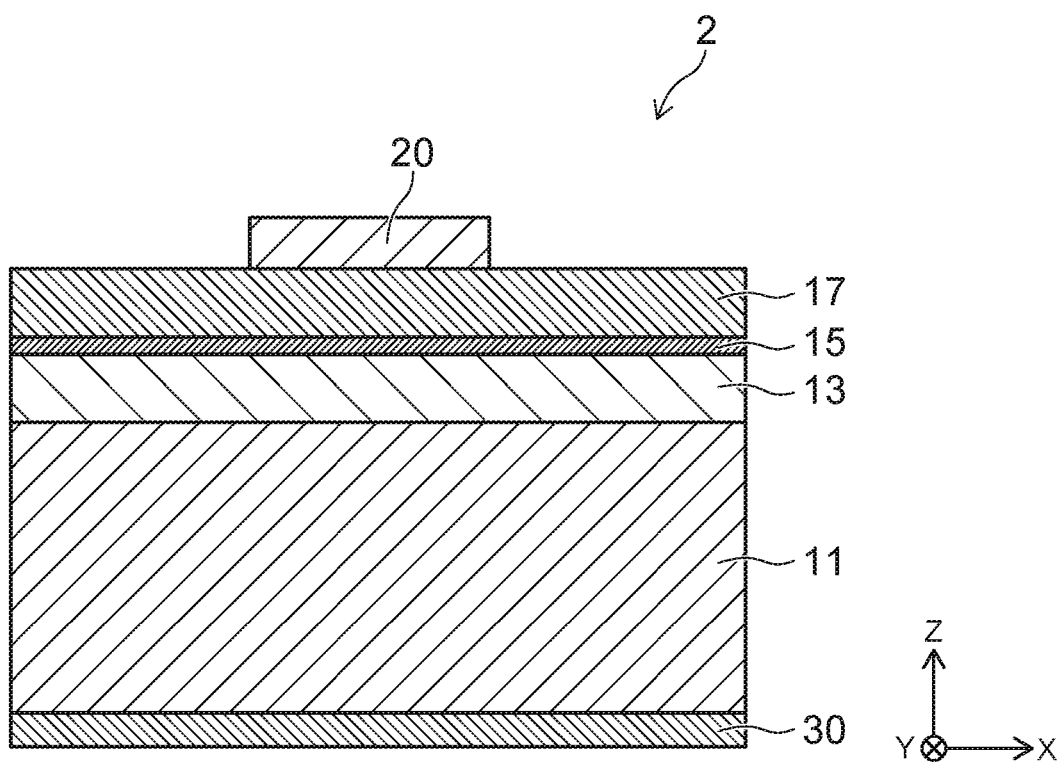
FIG. 4 is a schematic cross sectional view showing the semiconductor device according to the embodiment.

FIG. 4 is a schematic cross sectional view showing a semiconductor device 2 according to the embodiment. The semiconductor device 2 is, for example, a light emitting diode.

As shown in FIG. 4, the semiconductor device 2 includes a p-type GaAs substrate 11, a p-type cladding layer 13, a light emitting layer 15, and an n-type cladding layer 17. The p-type cladding layer 13, the light emitting layer 15 and the n-type cladding layer 17 are, for example, epitaxially grown on the p-type GaAs substrate 11. The p-type cladding layer 13 and the n-type cladding layer 17 are, for example, AlGaAs layers, respectively, and the light emitting layer 15 has the quantum well structure, for example, including GaAs and AlGaAs.

An electrode 30 is provided on a back surface of the p-type GaAs substrate 11, and the electrode 20 is provided on a front surface of the n-type classing layer 17. In this example, the n-type cladding layer 17 serves as the n-type semiconductor layer 10. The electrode 30 is, for example, provided to cover the whole back surface of the p-type GaAs substrate 11. The electrode 20 is, for example, selectively formed on the n-type cladding layer 17 through the lift-off processes.

Figure 5A:
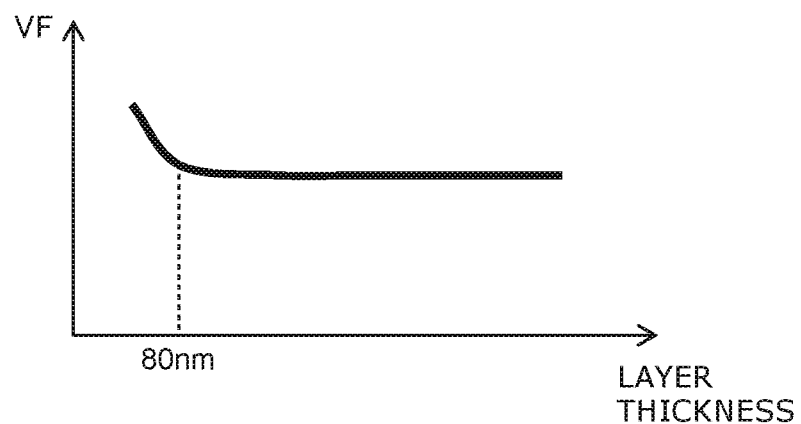
FIGS. 5A to 5C are graphs showing characteristics of the semiconductor device according to the embodiment.
Figure 5B:
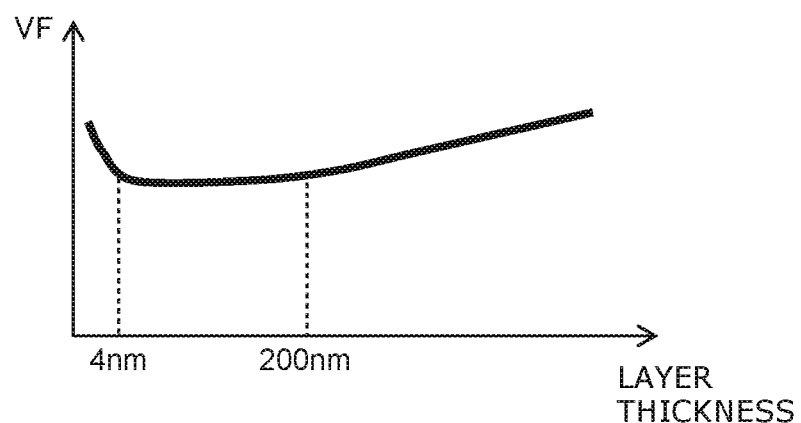
Figure 5C:
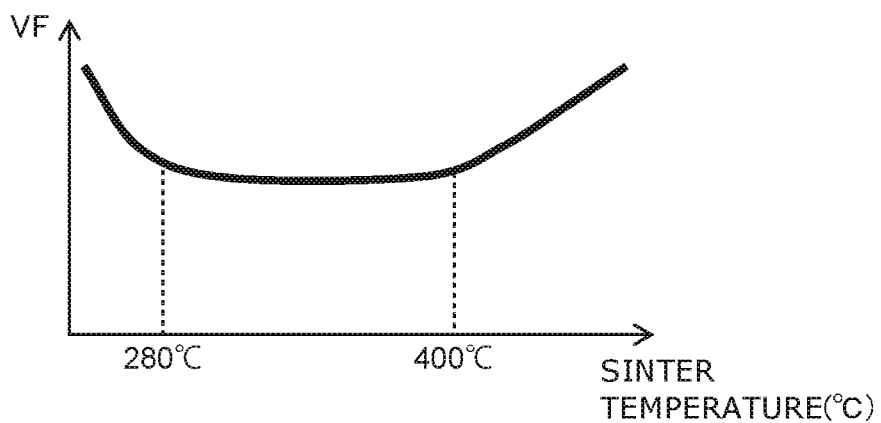

FIGS. 5A to 5C are graphs showing characteristics of the semiconductor device 2 according to the embodiment.

In FIGS. 5A and 5B, the forward voltages VF are shown respectively that depend on a layer thickness of the first layer 21a and the second layer 21b in the electrode 20. In FIG. 5C, the forward voltage VF is shown that depends on the sintering temperature. Here, VF is a voltage between the electrode 20 and the electrode 30, when the forward current of 10 mA is flown therethrough.

As shown in FIG. 5A, VF decreases with increasing layer thickness of the first layer 21a, and VF is constant when the thickness of the first layer 21a in the Z-direction is 80 nm or more. At this time, a value of VF is about 1.6 V.

As shown in FIG. 5B, VF decreases with increasing layer thickness of the second layer 21b, and VF has a minimum value when the thickness in the Z-direction exceeds 4 nm. VF increases gradually as increasing layer thickness further. When the thickness of the second layer 21b in the Z-direction exceeds 200 nm, VF increases with the larger rate. This is considered to be the effect due to the increase of the second element concentration at the interface between the n-type cladding layer 17 and the electrode 20, which is induced by the total amount of the second elements increased as the layer thickness of the second layer 21b increases. In the example shown in FIG. 5B, the layer thickness of the first layer 21a is in a range of 80 to 500 nm.

As shown in FIG. 5C, VF decreases as the sintering temperature rises. When the sintering temperature exceeds 280° C., VF is constant. When the sintering temperature further exceeds 400° C., VF increases. That is, it is considered that when the sinter temperature exceeds 400° C., the diffusion of germanium and zinc are significant and makes the VF increase.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
an n-type semiconductor layer;
a first metal layer provided on the n-type semiconductor layer, the first metal layer including first atoms capable of being n-type impurities in the n-type semiconductor layer;
a second metal layer provided on the first metal layer, the second metal layer including titanium atoms;
a third metal layer provided on the second metal layer; and
a second atom capable of being a p-type impurity in the n-type semiconductor layer, the second atom and a part of the titanium atoms being included in a vicinity of an interface between the first metal layer and the second metal layer.

2. The device according to claim 1, wherein
a part of the first atoms is further included in the vicinity of the interface between the first metal layer and the second metal layer.

3. The device according to claim 1, wherein
the second atom is one of a zinc atom, a magnesium atom and a beryllium atom.

4. The device according to claim 1, wherein
the first metal layer includes gold atoms and the first atoms, the first atoms being germanium.

5. The device according to claim 1, wherein
the third metal layer includes gold atoms.

6. The device according to claim 1, further comprising:
a fourth metal layer provided between the second metal layer and the third metal layer, the fourth metal layer including platinum atoms.

7. The device according to claim 1, wherein
the second atom is provided in a plurality, the plurality of second atoms being distributed with a first concentration peak in the vicinity of the interface between the first metal layer and the second metal layer.

8. The device according to claim 7, wherein
the plurality of second atoms is distributed in the first metal layer with a second concentration peak in a vicinity of an interface between the first metal layer and the n-type semiconductor layer.

9. The device according to claim 7, wherein
the first atoms being distributed in the first metal layer with a third concentration peak in the vicinity of the interface between the first metal layer and the second metal layer.

* * * * *